United States Patent
Nimmakayala et al.

(10) Patent No.: US 7,323,130 B2
(45) Date of Patent: Jan. 29, 2008

(54) MAGNIFICATION CORRECTION EMPLOYING OUT-OF-PLANE DISTORTION OF A SUBSTRATE

(75) Inventors: Pawan K. Nimmakayala, Austin, TX (US); Sidlgata V. Sreenivasan, Austin, TX (US); Byung-Jin Choi, Round Rock, TX (US); Anshuman Cherala, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 658 days.

(21) Appl. No.: 10/735,110

(22) Filed: Dec. 12, 2003

(65) Prior Publication Data

US 2004/0146792 A1 Jul. 29, 2004

Related U.S. Application Data

(60) Provisional application No. 60/433,477, filed on Dec. 13, 2002.

(51) Int. Cl.
*B29C 41/02* (2006.01)
*B29C 41/48* (2006.01)
*B29C 41/50* (2006.01)
*B29C 53/02* (2006.01)

(52) U.S. Cl. .................... 264/319; 264/339
(58) Field of Classification Search ........... 264/293, 264/320, 339, 319; 430/22, 322
See application file for complete search history.

(56) References Cited

U.S. PATENT DOCUMENTS

| 3,783,520 A | 1/1974 | King |
| 4,256,829 A | 3/1981 | Daniel |
| 4,326,805 A | 4/1982 | Feldman et al. |
| 4,512,848 A | 4/1985 | Deckman et al. |
| 4,600,309 A | 7/1986 | Fay |

(Continued)

FOREIGN PATENT DOCUMENTS

DE 2800476 7/1978

(Continued)

OTHER PUBLICATIONS

Feldman et al., "Wafer Chuck for Magnification correction in X-ray Lithography," Journal of Vaccum Science and Technology, Nov./Dec. 1998, pp. 3476-3479, vol. B 16(6).

(Continued)

*Primary Examiner*—Leo B. Tentoni
(74) *Attorney, Agent, or Firm*—Kelly K. Kordzik; Fish & Richardson P.C.

(57) ABSTRACT

The present invention is directed to a method of controlling dimensional relations between an original pattern present in a mold and a recorded pattern formed in a layer of a substrate. In this manner, the size of the recorded pattern may appear to be magnified and/or reduced, when compared to the original pattern. To that end, the method comprises defining a region on the layer in which to produce the recorded pattern. The substrate is bent to produce a contoured surface in the region. Dimensional variations in the original pattern are produced by bending the mold, defining a varied pattern. The contoured surface and the mold are provided to have similar radii of curvatures. The varied pattern is then recorded in the layer. These and other embodiments of the present invention are discussed more fully below.

16 Claims, 8 Drawing Sheets

U.S. PATENT DOCUMENTS

| | | |
|---|---|---|
| 4,724,222 A | 2/1988 | Feldman |
| 4,731,155 A | 3/1988 | Napoli et al. |
| 4,848,911 A | 7/1989 | Uchida et al. |
| 4,929,083 A | 5/1990 | Brunner |
| 5,028,366 A | 7/1991 | Harakal et al. |
| 5,072,126 A | 12/1991 | Progler |
| 5,074,667 A | 12/1991 | Miyatake |
| 5,148,036 A | 9/1992 | Matsugu et al. |
| 5,148,037 A | 9/1992 | Suda et al. |
| 5,204,739 A | 4/1993 | Domenicali |
| 5,206,983 A | 5/1993 | Guckel et al. |
| 5,414,514 A | 5/1995 | Smith et al. |
| 5,425,848 A | 6/1995 | Haisma et al. |
| 5,563,684 A | 10/1996 | Stagaman |
| 5,601,641 A | 2/1997 | Stephens |
| 5,633,505 A | 5/1997 | Chung et al. |
| 5,669,303 A | 9/1997 | Maracas et al. |
| 5,737,064 A | 4/1998 | Inoue et al. |
| 5,772,905 A | 6/1998 | Chou |
| 5,776,748 A | 7/1998 | Singhvi et al. |
| 5,802,914 A | 9/1998 | Fassler et al. |
| 5,808,742 A | 9/1998 | Everett et al. |
| 5,849,209 A | 12/1998 | Kindt-Larsen et al. |
| 5,849,222 A | 12/1998 | Jen et al. |
| 5,877,036 A | 3/1999 | Kawai |
| 5,877,861 A | 3/1999 | Ausschnitt et al. |
| 5,900,160 A | 5/1999 | Whitesides et al. |
| 5,948,470 A | 9/1999 | Harrison et al. |
| 5,999,245 A | 12/1999 | Suzuki |
| 6,019,166 A | 2/2000 | Viswanath et al. |
| 6,039,897 A | 3/2000 | Lochhead et al. |
| 6,049,373 A | 4/2000 | Miyatake |
| 6,088,103 A | 7/2000 | Everett et al. |
| 6,128,085 A | 10/2000 | Buermann et al. |
| 6,137,562 A | 10/2000 | Masuyuki et al. |
| 6,150,231 A | 11/2000 | Muller et al. |
| 6,180,239 B1 | 1/2001 | Whitesides et al. |
| 6,285,439 B1 | 9/2001 | Miyatake |
| 6,295,120 B1 | 9/2001 | Miyatake |
| 6,309,580 B1 | 10/2001 | Chou |
| 6,334,960 B1 | 1/2002 | Willson et al. |
| 6,383,888 B1 | 5/2002 | Stirton |
| 6,388,755 B1 | 5/2002 | Zhao |
| 6,391,217 B2 | 5/2002 | Schaffer et al. |
| 6,482,742 B1 | 11/2002 | Chou |
| 6,489,068 B1 | 12/2002 | Kye |
| 6,517,995 B1 | 2/2003 | Jacobenson et al. |
| 6,518,168 B1 | 2/2003 | Clem et al. |
| 6,518,189 B1 | 2/2003 | Chou |
| 6,522,411 B1 | 2/2003 | Moon et al. |
| 6,580,172 B2 | 6/2003 | Mancini et al. |
| 6,630,410 B2 | 10/2003 | Trapp et al. |
| 6,636,311 B1 | 10/2003 | Ina et al. |
| 6,646,662 B1 | 11/2003 | Nebashi et al. |
| 6,665,119 B1 | 12/2003 | Kurtz et al. |
| 6,696,220 B2 | 2/2004 | Bailey et al. |
| 6,713,238 B1 | 3/2004 | Chou et al. |
| 6,770,852 B1 | 8/2004 | Stegner |
| 6,776,094 B1 | 8/2004 | Whitesides et al. |
| 6,791,669 B2 | 9/2004 | Poon |
| 6,809,356 B2 | 10/2004 | Chou |
| 6,828,244 B2 | 12/2004 | Chou |
| 6,908,861 B2 | 6/2005 | Sreenivasan et al. |
| 6,929,762 B2 * | 8/2005 | Rubin ..................... 264/40.1 |
| 6,980,282 B2 * | 12/2005 | Choi et al. ................ 355/72 |
| 2002/0018190 A1 | 2/2002 | Nogawa et al. |
| 2002/0042027 A1 | 4/2002 | Chou et al. |
| 2002/0093122 A1 | 7/2002 | Choi et al. |
| 2002/0094496 A1 | 7/2002 | Choi et al. |
| 2002/0132482 A1 | 9/2002 | Chou |
| 2002/0150398 A1 | 10/2002 | Choi et al. |
| 2002/0167117 A1 | 11/2002 | Chou |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0179354 A1 | 9/2003 | Araki et al. |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0033515 A1 | 2/2004 | Cao et al. |
| 2004/0036201 A1 | 2/2004 | Chou et al. |
| 2004/0046288 A1 | 3/2004 | Chou |
| 2004/0053146 A1 | 3/2004 | Sreenivasan et al. |
| 2004/0086793 A1 | 5/2004 | Sreenivasan et al. |
| 2004/0089979 A1 | 5/2004 | Rubin |
| 2004/0110856 A1 | 6/2004 | Young et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0223131 A1 | 11/2004 | Choi et al. |

FOREIGN PATENT DOCUMENTS

| | | |
|---|---|---|
| JP | 1-196749 | 8/1989 |
| JP | 02-24848 | 1/1990 |
| JP | 02-92603 | 4/1990 |
| WO | WO 99/05724 | 2/1999 |
| WO | WO 00/21689 | 4/2000 |
| WO | WO 01/47003 | 6/2001 |
| WO | WO 01/69317 | 9/2001 |
| WO | WO 01/79592 | 10/2001 |
| WO | WO 01/79933 | 10/2001 |
| WO | WO 01/90816 | 11/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

Chou et al., "Imprint of Sub-25 nm Vias and Trenches in Polymers," Applied Physics Letters, Nov. 20, 1995, pp. 3114-3116, vol. 67(21).

Chou et al., "Imprint Lithography with 25-Nanometer Resolution," Science, Apr. 5, 1996, pp. 85-87, vol. 272.

Haisma et al., "Mold-Assisted Nanolithography: A Process for Reliable Pattern Replication," Journal of Vacuum Science and Technology, Nov./Dec. 1996, pp. 4124-4128, vol. B 14(6).

Chou et al., "Imprint Lithography with Sub-10nm Feature Size and High Throughput," Microelectronic Engineering, 1997, pp. 237-240, vol. 35.

Feldman et al., "Wafer chuck for magnification correction in x-ray lithography," American Vacuum Society, 1998, pp. 3476-3479.

Scheer et al., "Problems of the Nanoimprinting Technique for Nanometer Scale Pattern Definition," Journal of Vacuum Science and Technology, Nov./Dec. 1998, pp. 3917-3921, vol. B 16(6).

Colburn. et al., "Step and Flash Imprint Lithography: A New Approach to High-Resolution Patterning", Proc. of SPIE, 1999, pp. 379-389, vol. 3676.

Chou et al., "Lithographically-Induced Self Assembly of Periodic Polymer Micropillar Arrays," Journal of Vacuum Science and Technology, Nov./Dec. 1999, pp. 3197-3202, vol. B 17(6).

Ruchhoeft et al., "Patterning Curved Surfaces: Template Generation by Ion Beam Proximity Lithography and Relief Transfer by Step and Flash Imprint Lithography," Journal of Vacuum Science and Technology, 1999, pp. 2965-2982, vol. 17.
Choi et al., "Design of Orientation Stages for Step and Flash Imprint Lithography," Precision Engineering, Journal of the International Societies for Precision Engineering and Nanotechnology, 2001, pp. 192-199, vol. 25.
Chou, "Nanoimprint Lithography and Lithographically Induced Self-Assembly," MRS Bulletin, Jul. 2001, pp. 512-517.
Choi et al., "High Precision Orientation Alignment and Gap Control Stages for Imprint Lithography Processes," U.S. Appl. No. 09/698,317, filed Oct. 27, 2000.
Sreenivasan et al., "High-Resolution Overlay Alignment Methods and Systems for Imprint Lithography," U.S. Appl. No. 09/907,512, filed Jul. 16, 2001.
Choi et al., "Systems For Magnification And Distortion Correction For Imprint Lithography Processes," U.S. Appl. No. 10/616,294, filed Jul. 9, 2003.
Krug et al., "Fine Patterning of Thin Sol-Gel Films," Journal of Non-Crystalline Solids, 1992, pp. 447-450, vol. 147 & 148.
Krauss et al., "Fabrication of Nanodevice Using Sub-25nm Imprint Lithography," Appl. Phys. Lett 67(21), 3114-3116, 1995.
Voisin, "Methods of Manufacturing a Lithography Template," U.S. Appl. No. 10/136,188, filed May 1, 2002.
Sreenivasan et al., "Step and Repeat Imprint Lithography Systems," U.S. Appl. No. 10/194,414, filed Jul. 11, 2002.
Sreenivasan et al., "Step and Repeat Imprint Lithography Processes," U.S. Appl. No. 10/194,991, filed Jul. 11, 2002.
Otto M. et al., "Step and Repeat UV-Nanoimprint Lithography: Material Issues," Nanoimprint and Nanoprint Technology Conference, San Francisco, Dec. 11-13, 2002.
Johnson, et al., "Advances in Step and Flash Imprint Lithography," SPIE Microlithography Conference, Feb. 23-28, 2003.
Choi et al., "A Chucking System and Method for Modulating Shapes of Subtrates," U.S. Appl. No. 10/293,224, filed Nov. 13, 2002.
Choi et al., "A Method For Modulating Shapes of Substrates," U.S. Appl. No. 10/316,963, filed Dec. 11, 2002.
Voisin, "Methods of Inspecting A Lithography Template," U.S. Appl. 10/293,919, filed Nov. 13, 2002.
Choi et al., "A Conforming Template For Patterning Liquids Disposed On Substrates," U.S. Appl. No. 10/614,716, filed Jul. 7, 2003.
Sreenivasan et al., "Full-Water or Large Area Imprinting with Multiple Separated Sub-Fields for High Throughput Lithography," U.S. Appl. No. 10/788,700, filed Feb. 27, 2004.

U.S. Appl. No. 10/999,898, filed Nov. 30, 2004, Cherala et al.
Colburn et al., Step and Flash Imprint Lithography for sub-100 nm Patterning, Proceedings of SPIE vol. 3997, pp. 453-457, Jan. 1, 2000.
Heidari, Nanoimprint Lithography at the 6 in. Wafer Scale, J. Vac. Sci. Technol. B 18(6), pp. 3557-3560, Nov. 1, 2000.
Martin et al., Predication of Fabrication Distortions in Step and Flash Imprint Lithography Templates, Journal of Vacuum Science Technology B 20(6), pp. 2891-2895, Nov. 1, 2002.
White et al., Novel Alignment System for Imprint Lithography, J. Vac. Sci. Technol. B 18(6), pp. 3552-3556, Nov. 1, 2000.
Translation of Japanese Patent 02-92603.
Translation of Japanese Patent 02-24848.
Chou et al., Ultrafast and Direct Imprint of Nanostructures in Silicon, Nature, col. 417, (Jun. 2002), pp. 835-837, Jun. 1, 2002.
Chou et al., Nanoimprint Lithography, Journal of Vacuum Science Technolgoy B 14(16), pp. 4129-4133, Nov. 1, 1996.
Colburn et al., Development and Advantages of Step-and-Flash Lithography, Solid State Technology, Jul. 1, 2001.
Colburn et al., Characterization and Modeling of Volumetric and Mechanical Properties for Step and Flash Imprint Lithography Photopolymers, Journal of Vacuum Science Technology. vol. b. 19(6), Nov. 1, 2001.
Bailey et al., Step and Flash Imprint Lithography: Defect Analysis, Journal of Vacuum Science, B 19(6), pp. 2806-2810, Nov. 1, 2001.
Bailey et al., Step and Flash Imprint Lithography: Template Surface Treatment and Defect Analysis, Journal of Vacuum Science, B 18(6), pp. 3572-3577, Nov. 1, 2000.
Wronosky et al., Wafer and Reticle Positioning System for the Extreme Ultraviolet Lithography Engineering Test Stand, Emerging Lithography Technologies, Proceedings of SPIE vol. 3997, pp. 829-839, Jul. 1, 2000.
Schneider et al., Stripes of Partially Fluorinated Alkyl Chains: Dipolar Langmuir Monolayers.
Park et al., Aligning Liquid Crystals Using Replicated Nanopatterns, PSI Scientific Report 2002, vol. VII, p. 85, Mar. 1, 2003.
U.S. Appl. No. 11/142,834, naming Inventors Cherala et al., entitled Method of Varying Dimensions of a Substrate during Nano-Scale Manufacturing, filed Jun. 1, 2005.
U.S. Appl. No. 11/142,839, naming Inventors Cherala et al., entitled Apparatusa to Vary Dimensions of a Substrate during Nano-Scale Manufacturing, filed Jun. 1, 2005.

* cited by examiner

MAGNIFICATION CORRECTION EMPLOYING OUT-OF-PLANE DISTORTION OF A SUBSTRATE

CROSS-REFERENCE TO RELATED APPLICATIONS

The present application claims priority to U.S. provisional patent application No. 60/433,477 filed on Dec. 13, 2002, entitled "Method and System for Magnification and Distortion Control for Layer-to-Layer Alignment in Imprint Lithography," which is incorporated by reference herein.

BACKGROUND OF THE INVENTION

The field of invention relates generally to lithography systems. More particularly, the present invention is directed to controlling the relative dimensions of recorded patterns and original patterns during lithography processes.

Great interest surrounds magnification and reduction of pattern sizes during lithographic processes. As discussed by Feldman et al., in WAFER CHUCK FOR MAGNIFICATION CORRECTION IN X-RAY LITHOGRAPHY, J. Vac. Sci. Technol. B 16(6), November/December 1998 pp. 3476-3479, one method to correct magnification, involved bending a wafer to conform to a chuck surface, a portion of which is a sphere of adjustable radius. As a result, both increases and decreases in a pattern size may be accommodated by using convex and concave spherical surfaces.

United States patent application number 09/907,512 entitled HIGH RESOLUTION OVERLAY ALIGNMENT METHODS & SYSTEM FOR IMPRINT LITHOGRAPHY, filed Jul. 16, 2001 (now U.S. Pat. No. 6,921,615), discloses correction of magnification errors during imprint lithography processes. Specifically, disclosed is a template adjustment device that may be coupled to a support configured to hold the template during use. The template adjustment device may be configured to alter the size of the template during use. This may be achieved by applying forces to, or altering the temperature of, the template. Similarly, the dimensions of the substrate may be altered, in lieu thereof or in conjunction therewith. In this manner, compensation of magnification errors may be achieved to ensure that a template or photolithographic mask used to pattern a layer is properly adjusted with an existing patterned layer disposed on the substrate.

A need exists, therefore, to provide improved control over relative dimensional sizes of an original pattern disposed on a mold and a recorded pattern on a substrate.

SUMMARY OF THE INVENTION

The present invention is directed to a method of controlling dimensional differences/similarities between an original pattern present in a mold and a recorded pattern present in a layer of a substrate. In this manner, the size of the recorded pattern may appear to be magnified and/or reduced, when compared to the original pattern. To that end, the method comprises defining a region on the layer in which to produce the recorded pattern. The substrate is bent to produce a contoured substrate surface in the region. Dimensional variations in the original pattern are produced by bending the mold, defining a varied pattern. The contoured surface and the mold are provided to have similar radii of curvatures. The varied pattern is then recorded in the layer. These and other embodiments of the present invention are discussed more fully below.

DETAILED DESCRIPTION OF THE INVENTION

Figure 1:
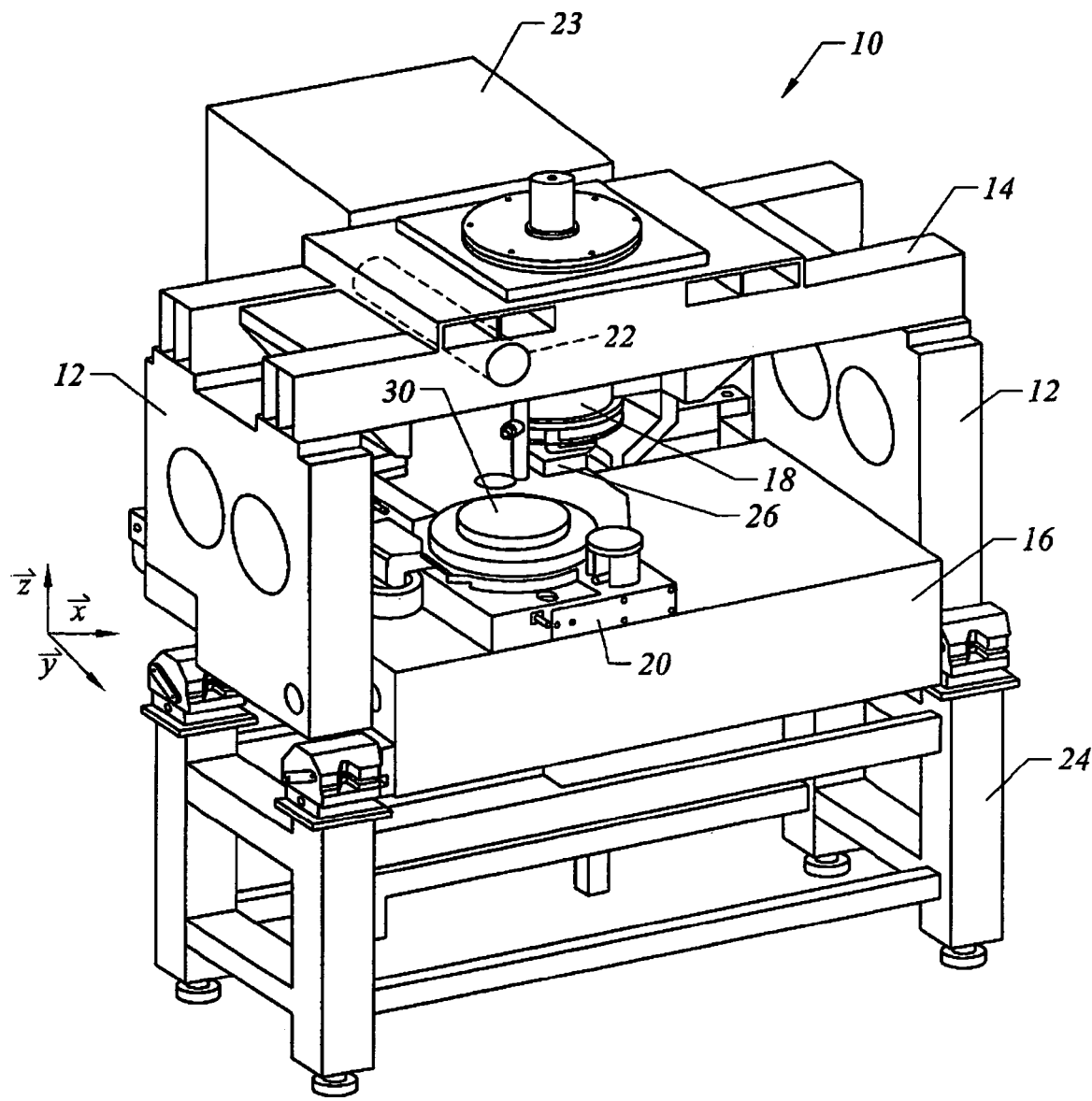
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart and typically formed from thermally stable materials, e.g., materials having a thermal expansion coefficient of less than about 10 ppm/degree Centigrade at about room temperature (e.g., 25 degrees Centigrade). To that end, bridge supports 12, bridge 14, and/or stage support 16 may be fabricated from one or more of the following materials: silicon carbide, iron alloys available under the trade name INVAR®, or name SUPER INVAR™, and/or ceramics, including but not limited to ZERODUR® ceramic. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes, but may move along the Z axis, as well. A radiation source 22 is coupled to system 10 to impinge actinic radiation upon motion stage 20. As shown, radiation source 22 is coupled to bridge 14 and includes a power generator 23 connected to radiation source 22. The components of system 10 are supported by table 24 that may be constructed to isolate the components of system 10 from vibrations in the surrounding environment. An exemplary table 24 is available from Newport Corporation of Irvine, Calif.

Figure 2:
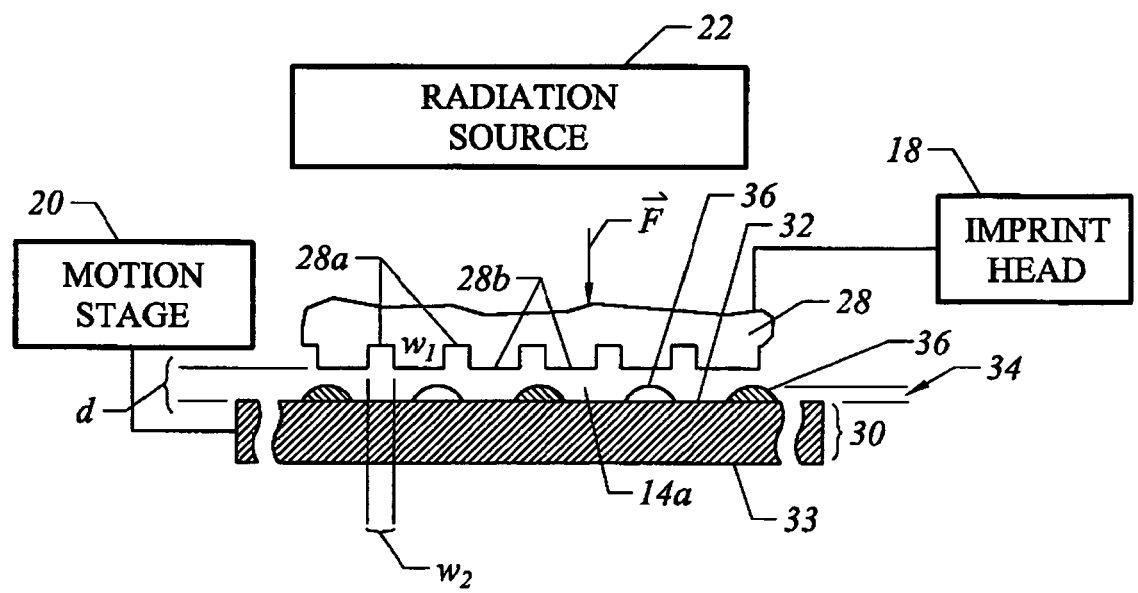
FIG. 2 is a simplified elevation view of a lithographic system shown in FIG. 1.

Referring to both FIGS. 1 and 2, connected to imprint head 18 is a template 26 having a mold 28 thereon. Mold 28 includes a plurality of features defined by a plurality of spaced-apart recessions 28a and protrusions 28b. The plurality of features defines an original pattern that is to be transferred into a wafer 30 positioned on motion stage 20. To that end, imprint head 18 is adapted to move along the Z axis and vary a distance "d" between mold 28 and wafer 30, but may move along the X and Y axes, as well. In this manner, the features on mold 28 may be imprinted into a flowable region of wafer 30, discussed more fully below. Radiation source 22 is located so that mold 28 is positioned between radiation source 22 and wafer 30. As a result, mold 28 is fabricated from material that allows it to be substantially transparent to the radiation produced by radiation source 22.

Figure 3:
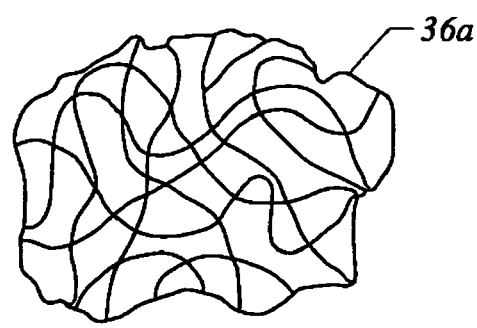
FIG. 3 is a simplified representation of material from which an imprinting layer, shown in FIG. 2, is comprised before being polymerized and cross-linked.

Referring to both FIGS. 2 and 3, a flowable region, such as an imprinting layer 34, is disposed on a portion of surface 32 that presents a substantially planar profile. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835-837, June 2002. In the present embodiment, however, flowable region consists of imprinting layer 34 being deposited as a plurality of spaced-apart discrete beads 36 of material 36a on wafer 30, discussed more fully below. Imprinting layer 34 is formed from a material 36a that may be selectively polymerized and cross-linked to record the original pattern therein, defining a recorded pattern. Material 36a is shown in FIG. 4 as being cross-linked at points 36b, forming cross-linked polymer material 36c.

Figure 5:
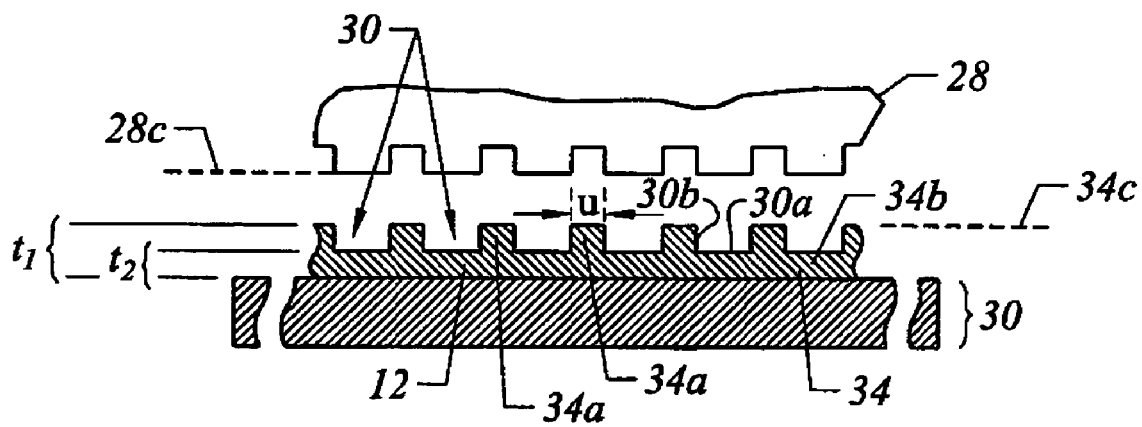
FIG. 5 is a simplified elevation view of a mold spaced-apart from the imprinting layer, shown in FIG. 1, after patterning of the imprinting layer.

Referring to FIGS. 2, 3 and 5, the pattern recorded in imprinting layer 34 is produced, in part, by mechanical contact with mold 28. To that end, imprint head 18 reduces the distance "d" to allow imprinting layer 34 to come into mechanical contact with mold 28, spreading beads 36 so as to form imprinting layer 34 with a contiguous formation of material 36a over surface 32. In one embodiment, distance "d" is reduced to allow sub-portions 34a of imprinting layer 34 to ingress into and fill recessions 28a.

To facilitate filling of recessions 28a, material 36a is provided with the requisite properties to completely fill recessions 28a while covering surface 32 with a contiguous formation of material 36a. In the present embodiment, sub-portions 34b of imprinting layer 34 in superimposition with protrusions 28b remain after the desired, usually minimum distance "d", has been reached, leaving sub-portions 34a with a thickness $t_1$, and sub-portions 34b with a thickness, $t_2$. Thicknesses "$t_1$" and "$t_2$" may be any thickness desired, dependent upon the application. For example, $t_1$ may be selected so as to be no greater than twice the width u of sub-portions 34a, i.e., $t_1 \leqq 2u$, shown more clearly in FIG. 5, or thicknesses $t_1$ and $t_2$ may be established so that $|(t_1-t_2)| \leqq 2u$.

Figure 4:
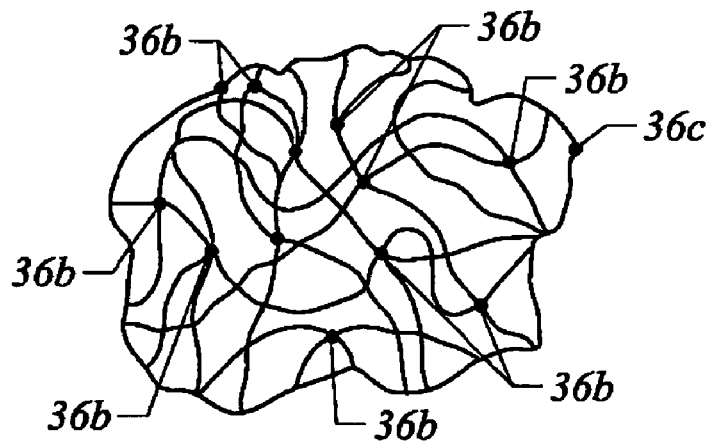
FIG. 4 is a simplified representation of cross-linked polymer material into which the material shown in FIG. 3 is transformed after being subjected to radiation.
Figure 6:
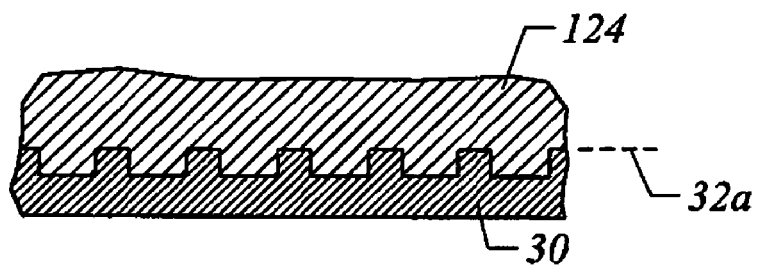
FIG. 6 is a simplified elevation view of an additional imprinting layer positioned atop of the substrate shown in FIG. 5, after the pattern in the first imprinting layer is transferred therein.

Referring to FIGS. 2, 3 and 4, after a desired distance "d" has been reached, radiation source 22 produces actinic radiation that polymerizes and cross-links material 36a, forming cross-linked polymer material 36c. To that end, an exemplary radiation source 22 may produce ultraviolet radiation; however, other radiation sources may be employed, such as thermal, electromagnetic and the like. The selection of radiation employed to initiate the polymerization of the material in imprinting layer 34 is known to one skilled in the art and typically depends on the specific application which is desired. As a result of exposure to actinic radiation, the composition of imprinting layer 34 transforms from material 36a to material 36c, which is a solid. Specifically, material 36c is solidified to provide side 34c of imprinting layer 34 with a shape conforming to a shape of a surface 28c of mold 28, shown more clearly in FIG. 5. After imprinting layer 34 is transformed to consist of material 36c, shown in FIG. 4, imprint head 18, shown in FIG. 2, is moved to increase distance "d" so that mold 28 and imprinting layer 34 are spaced-apart. Additional processing may be employed to complete the patterning of wafer 30. For example, wafer 30 and imprinting layer 34 may be etched to transfer the pattern of imprinting layer 34 into wafer 30, providing a patterned surface 32a, shown in FIG. 6.

It is desired, that mold 28 have dimensions commensurate with the dimensions of a region of wafer 30 upon which the pattern is to be recorded to prevent distortions in the pattern recorded into imprinting layer 34. Specifically, distortions in the pattern recorded into imprinting layer 34 may arise from, inter alia, dimensional variations of imprinting layer 34 and wafer 30. These dimensional variations, which may be due in part to thermal fluctuations, as well as, inaccuracies in previous processing steps that produce what is commonly referred to as magnification/run-out errors. The magnification/run-out errors occur when a region of wafer 30 in which the original pattern is to be recorded exceeds the area of the original pattern. Additionally, magnification/run-out errors may occur when the region of wafer 30, in which the original pattern is to be recorded, has an area smaller than the original pattern. The deleterious effects of magnification/run-out errors are exacerbated when forming multiple layers of imprinted patterns, shown as imprinting layer 124 in superimposition with patterned surface 32a, shown in FIG. 6. Proper alignment between two superimposed patterns is difficult in the face of magnification/run-out errors in both single-step full wafer imprinting and step-and-repeat imprinting processes.

Figure 7:
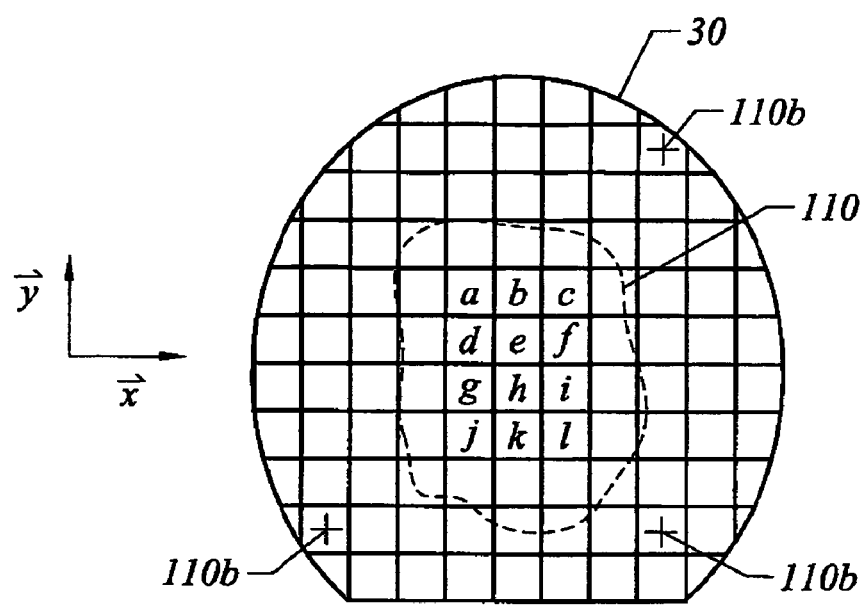
FIG. 7 is a top-down view of a wafer, shown in FIGS. 2, 5 and 6, upon which imprinting layers are disposed.
Figure 8:
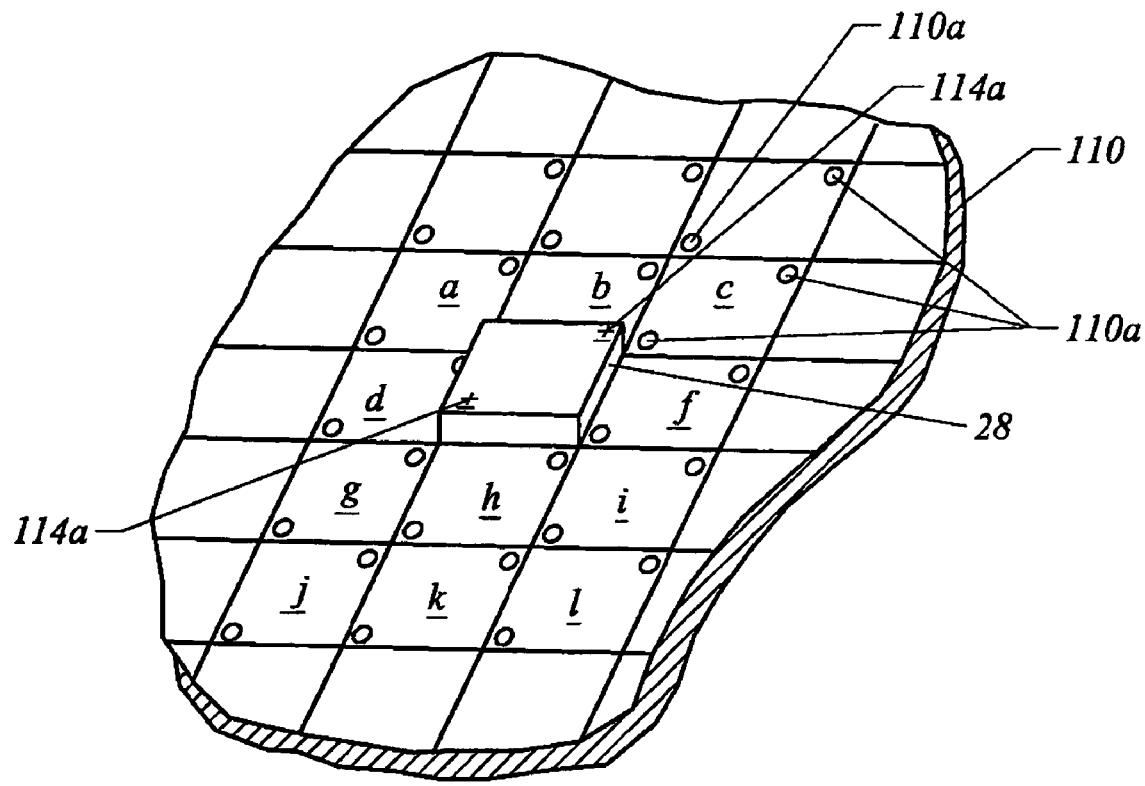
FIG. 8 is a detailed view of FIG. 7 showing the position of the mold in one of the imprint regions.

Referring to FIGS. 7 and 8, a step-and-repeat process includes defining a plurality of regions, shown as, a-l, on wafer 30 in which the original pattern on mold 28 will be recorded. The original pattern on mold 28 may be coextensive with the entire surface of mold 28, or simply located to a sub-portion thereof. The present invention will be discussed with respect to the original pattern being coextensive with the surface of mold 28 that faces wafer 30. Proper execution of a step-and-repeat process may include proper alignment of mold 28 with each of regions a-l. To that end, mold 28 includes alignment marks 114a, shown as a "+" sign. One or more of regions a-l includes fiducial marks 110a. By ensuring that alignment marks 114a are properly aligned with fiducial marks 110a, proper alignment of mold 28 with one of regions a-l in superimposition therewith is ensured. To that end, machine vision devices (not shown) may be employed to sense the relative alignment between alignment marks 114a and fiducial marks 110a. In the present example, proper alignment is indicated upon alignment marks 114a being in superimposition with fiducial marks 110a. With the introduction of magnification/run-out errors, proper alignment becomes very difficult.

However, in accordance with one embodiment of the present invention, magnification/run-out errors are reduced, if not avoided, by creating relative dimensional variations between mold 28 and wafer 30. In this manner, the area of the original pattern is made coextensive with the area of the region a-l in superimposition therewith.

The present invention attenuates, if not abrogates, magnification/run out errors by providing control of the relative dimensions between the original pattern and the region of wafer upon which the original pattern is to be recorded. Specifically, the present invention allows control of the dimensional relations between the original pattern present in mold 28 and the recorded pattern formed on wafer 30. In this manner, the size of the recorded pattern may appear to be magnified and/or reduced, when compared to the original pattern. This may be achieved so that the sizes of the original pattern and the recorded pattern are equal.

Figure 9:
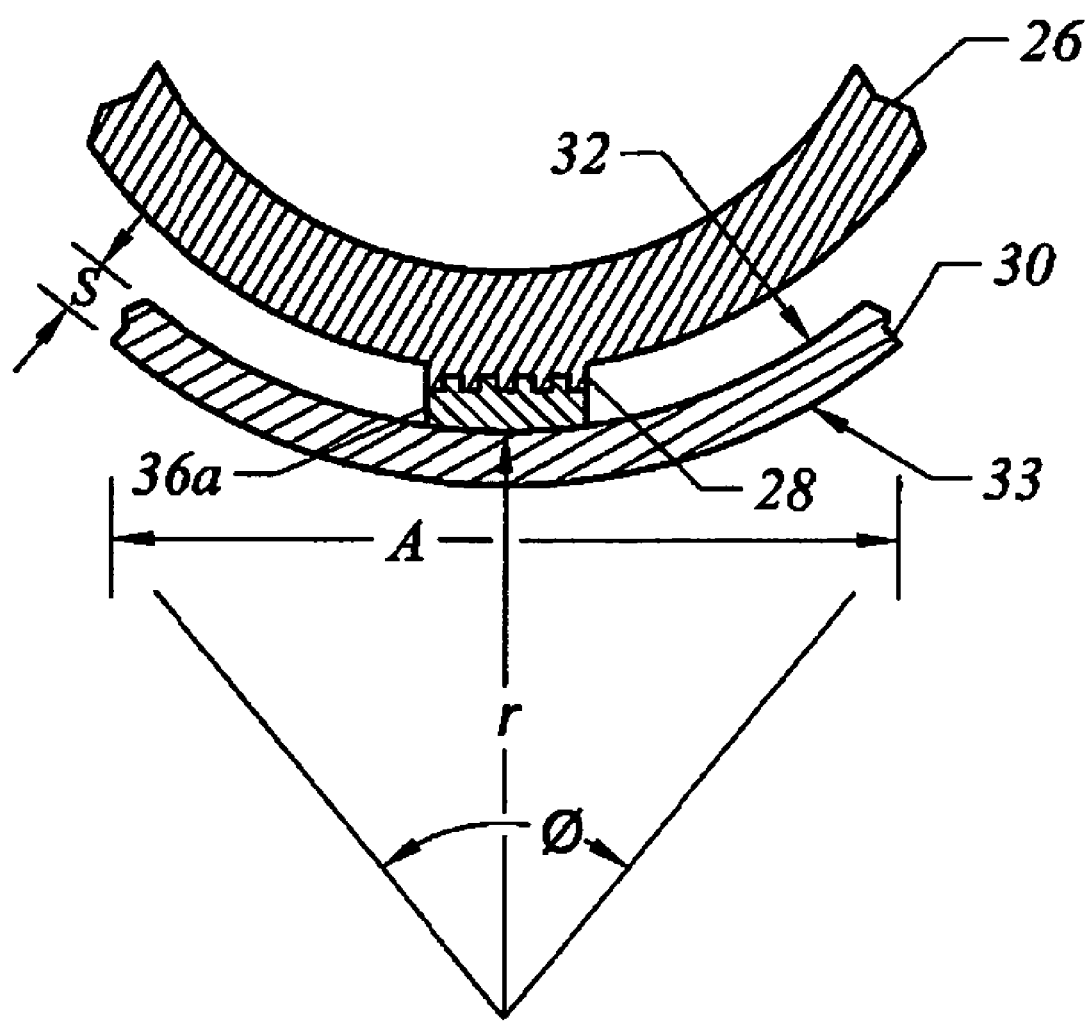
FIG. 9 is a simplified cross-sectional plan view of out-of-plane distortion of the template and wafer shown in FIGS. 1 and 2.

Referring to FIG. 9, control of the relative dimensions between the original pattern and the recorded pattern is provided by bending of mold 28 and wafer 30, out of the neutral, i.e., unbent, state. Consider that an area A, with a unit depth, of surface 32 may be defined as follows:

$$A = \phi r \qquad 1.$$

where r is a radius of a sphere about which surface 32 is curved and $\phi$ is the angle through which surface 32 is bent. It is seen that changes in area dA may be defined as follows:

$$dA = \phi dr \qquad 2.$$

so that the change in area A may ultimately be defined as follows:

$$dA = As/2r \qquad 3.$$

where s is a thickness of wafer 30 measured between surface 32 and side 33. Thus, were surface 32 provided with a concave shape, the area A would be is decreased, reduced. Conversely, were surface 32 provided with a convex shape, the area A would be increased, magnified. In a similar fashion, bending of template 26 would result in dimensional changes in mold 28 in accordance with equations 1-3, and, hence, the pattern on mold 28 would be magnified or reduced.

Referring to FIGS. 4 and 9, employing the concepts set forth above, compensation for magnification/run out errors is achieved by bending both template 26 and wafer 30. In this manner it is possible to obtain a desired amount of relative dimensional variations between a pattern on mold 28 and the region upon wafer 30 where the original pattern is to be recorded. For example, to magnify the original pattern on mold 28, template 26 would be bent so that surface 28c forms a convex shape. Surface 32 of wafer 30 would be bent to form a concave shape. Material 36a disposed between mold 28 and wafer 30 would then be solidified and polymerized, as discussed above, to form material 36c. Thereafter, mold 28 and wafer 30 would be returned to a neutral, unbent state. The net result is that the recorded pattern would be magnified when compared with the original pattern of mold 28. The bending of both mold 28 and substrate 30 contributes to the magnification of the recorded pattern. Specifically, the magnification provided by wafer 30 resulted from wafer 30 returning to the neutral state. The magnification provided by mold 28 results from the expansion of the recorded pattern by bending of template 26 from the neutral state. In this fashion, it can be said that magnification is a function of the out-of-plane distortion applied to the original pattern. The dominant contributor to the magnification of the recorded pattern is defined by the relative thicknesses s between wafer 30 and template 26. Specifically, the greater the s, the greater the contribution to the magnification in recorded pattern. Often, however, it is desired to minimize the out-of-plane distortion when achieving a desired magnification. To that end, for a given magnification requirement, it would be desirable to increase the distance of either template 26, wafer 30 or both. It has been found preferable to increase the distance of template 26, as the distance of wafer 30 is typically standardized.

Another characteristic that is desirable to obtain from out-of-plane distortion is uniform dimensional variations over area A. To that end, it has been found beneficial to ensure minimization of the shear force to which mold 28 and/or the region of wafer 30 in which a pattern is to be recorded is subjected. It is desired that this shear force is zero. This allows obtaining uniform bending of mold 28 and/or the region of wafer 30 in which the pattern is to be recorded.

Figure 10:
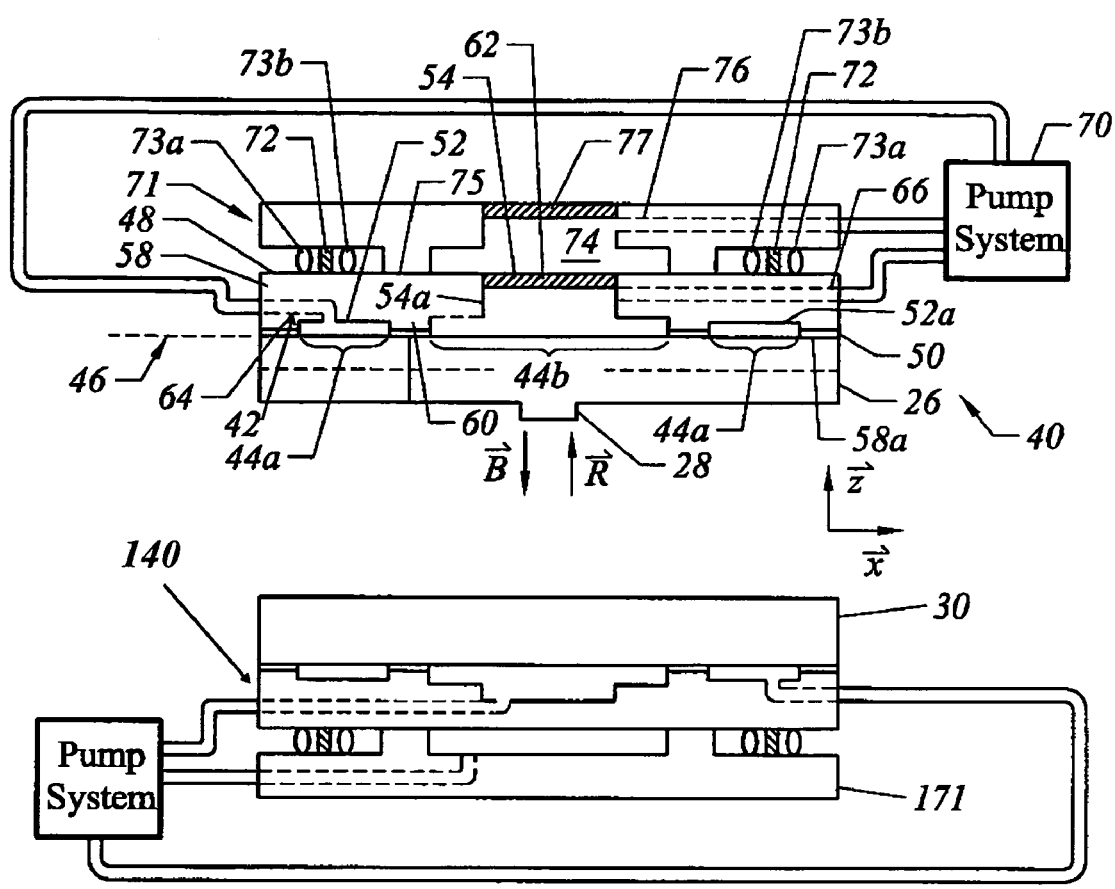
FIG. 10 is a cross-sectional view of a template chucking system and a wafer chucking system in accordance with the present invention.

Referring to FIG. 10, an apparatus to obtain uniform bending of template 26 and wafer 30 is shown as a template chucking system 40 and a wafer chucking system 140. Template chucking system 40 includes a chuck body 42 adapted to retain template 26 employing vacuum techniques. To that end, chuck body 42 includes first 46 and second 48 opposed sides. A side, or edge, surface 50 extends between first side 46 and second side 48. First side 46 includes a first recess 52 and a second recess 54, spaced-apart from first recess 52, defining first 58 and second 60 spaced-apart support regions. First support region 58 cinctures second support region 60 and the first 52 and second 54 recesses. Second support region 60 cinctures second recess 54. A portion 62 of chuck body 42 in superimposition with second recess 54 is transparent to radiation having a predetermined wavelength, such as the wavelength of the actinic radiation mentioned above. To that end, portion 62 is made from a thin layer of transparent material, such as glass. However, the material from which portion 62 is made may depend upon the wavelength of radiation produced by radiation source 22, shown in FIG. 2. Portion 62 extends from second side 48 and terminates proximate to second recess 54 and should define an area at least as large as an area of mold 28 so that mold 28 is in superimposition therewith. Formed in chuck body 42 are one or more throughways, shown as 64 and 66. One of the throughways, such as throughway 64 places first recess 52 in fluid communication with surface 50. The remaining throughway, such as throughway 66, places second recess 54 in fluid communication with surface 50.

It should be understood that throughway 64 may extend between second side 48 and first recess 52, as well. Similarly, throughway 66 may extend between second side 48 and second recess 54. What is desired is that throughways 64 and 66 facilitate placing recesses 52 and 54, respectively, in fluid communication with a pressure control system, such as a pump system 70.

Pump system 70 may include one or more pumps to control the pressure proximate to recesses 52 and 54, independently of one another. Specifically, when mounted to chuck body 42, template 26 rests against first 58 and second 60 support regions, covering first 52 and second 54 recesses. First recess 52 and a portion 44a of template 26 in superimposition therewith define a first chamber 52a. Second recess 54 and a portion 44b of template 26 in superimposition therewith define a second chamber 54a. Pump system 70 operates to control a pressure in first 52a and second 54a chambers. Specifically, the pressure is established in first chamber 52a to maintain the position of the template 26 with the chuck body 42 and reduce, if not avoid, separation of template 26 from chuck body 42 under force of gravity. The pressure in the second chamber 54a may differ from the pressure in the first chamber 52a to, inter alia, reduce distortions in the template 26 that occur during imprinting, by modulating a shape of template 26. For example, pump system 70 may apply a positive pressure in chamber 54a to compensate for any upward force R that occurs as a result of imprinting layer 34, shown in FIG. 5, contacting mold 28. For example, pump system 70 may apply a positive pressure in chamber 54a to compensate for any upward force R that occurs as a result of imprinting layer 34, shown in FIG. 5, contacting mold 28. In this manner, produced is a pressure differential between differing regions of side 46 so that bowing of template 26 and, therefore, mold 28 under force R is attenuated, if not avoided.

To provide out-of-plane distortion correction, chucking system 40 includes a shaping device 71 having a plurality of rigid pillars 72 each of which is positioned between two spaced-apart bladders 73a and 73b. Each pillar 72-bladders 73a and 73b combination defines a bending device. Although two bending devices are shown being spaced-apart, additional bending devices are usually present. Positioned between bending devices is a cavity 74 that is surrounded by a support 75. Chuck body 42 rests against support 75. A chamber is defined by cavity 74 and chuck body 42. The chamber is in fluid communication with pump system 70 via a conduit 76. Chuck body 42 is held firmly against shaping device 71 by evacuating the chamber defined by cavity 74 and chuck body 42. A portion 77 of shaping device 71 in superimposition with portion 62 is transparent to actinic radiation.

Out-of-plane distortion is achieved by selectively activating bladders 73a and 73b, thereby causing body of bending device to pivot about pillars. For example, were it desired to provide mold 28 with a convex surface, bladders 73b would be expanded. This would cause the body of shaping device 71 to bend such that central regions would move along the Z-axis toward chuck body 42. The bending motion of the body of shaping device 71 would then be transferred to chuck body 42 and, therefore, template 26. The longitudinal strain of bending of template 26 would then be transferred to mold 28 to achieve desired dimensional changes in the original pattern present thereon. In this example, magnification.

Were it desired to provide mold 28 with a concave surface, bladders 73a would be expanded. This would cause the body of shaping device 71 to bend such that central regions would move along the Z-axis away from chuck body 42. The bending motion of the body of shaping device 71 would then be transferred to chuck body 42 and, therefore, template 26. The longitudinal strain of bending of template 26 would then be transferred to mold 28 to achieve desired dimensional changes in the original pattern present thereon. In this example, reduction.

Employing a similar device, out-of plane distortion of wafer 30 could be achieved. To that end, a shaping device 171 would be included with wafer chucking system 140. Wafer chucking system 140 could be substantially identical to template chucking system 40, excepting that portion 62 may be obviated, were no actinic radiation to be transmitted therethrough. In this fashion, wafer 30 may be bent in a manner substantially similar to the bending of template 26.

Figure 11:
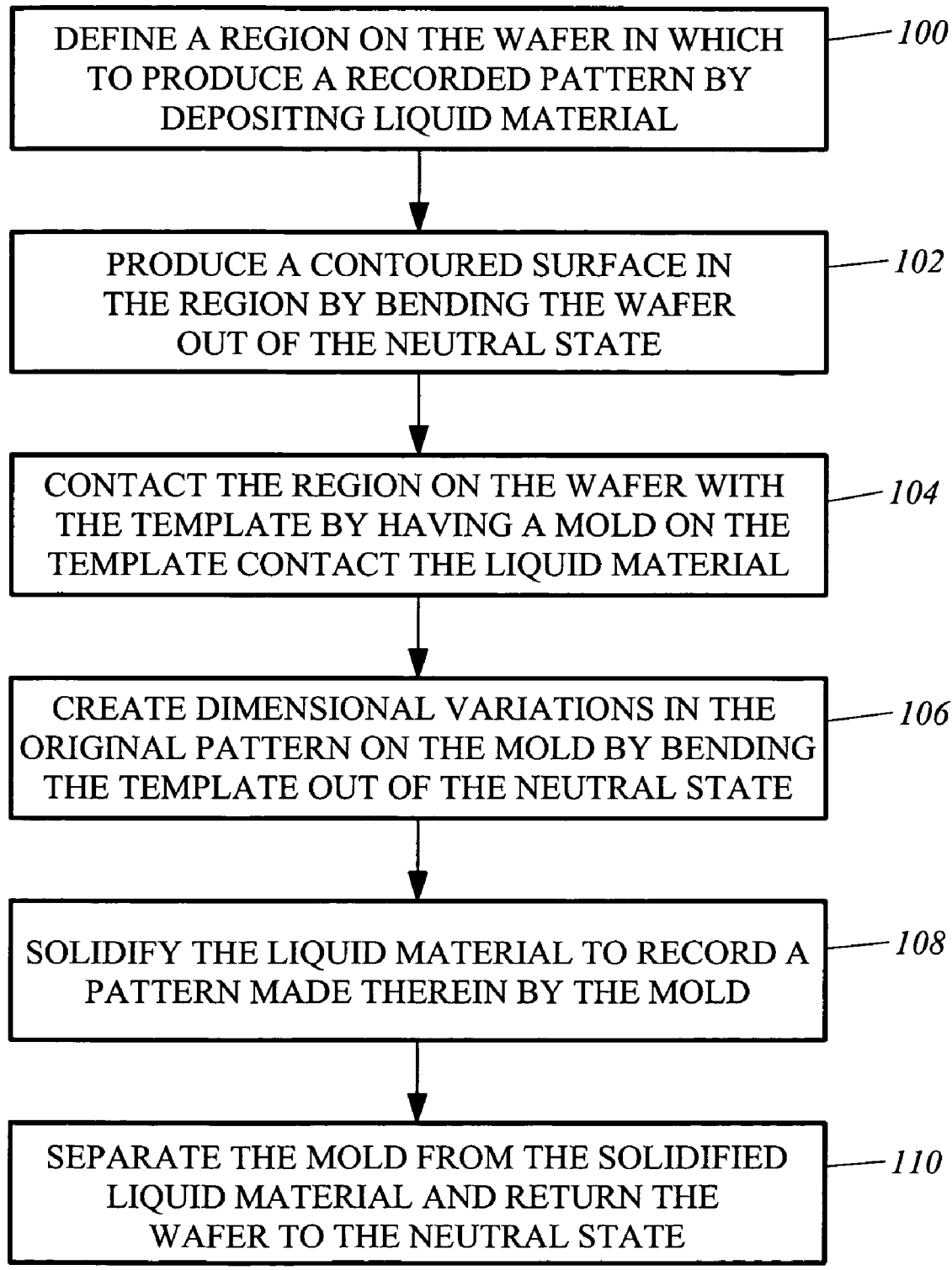
FIG. 11 is a flow diagram showing a method of controlling dimensional variations in patterns formed using imprint lithography techniques in accordance with the present invention.

Referring to FIGS. 5 and 11, in operation, a region on wafer 30 is defined in which to produce a recorded pattern by depositing beads 36 at step 100. At step 102, wafer 30 is bent to produce a contoured surface in the region. At step 104, contact is made between template 26 and the region on wafer 30 by having mold 28 contact beads 36. At step 106, dimensional variations in the original pattern of mold 28 are undertaken by bending the template 26. In this manner, material 36a, shown in FIG. 4, in droplets conforms to surface 28c of mold 28. At step 108, material 36c is formed, solidifying a pattern that is the inverse of the pattern in mold, forming a recorded pattern. Thereafter, the mold 28 material 36c, shown in FIG. 4, are separated and wafer 30 is returned to the neutral state at step 110. In this manner, the recorded pattern is the inverse of the original pattern in mold 28 with differing relative dimensional variations, i.e., magnified or reduced.

Figure 12:
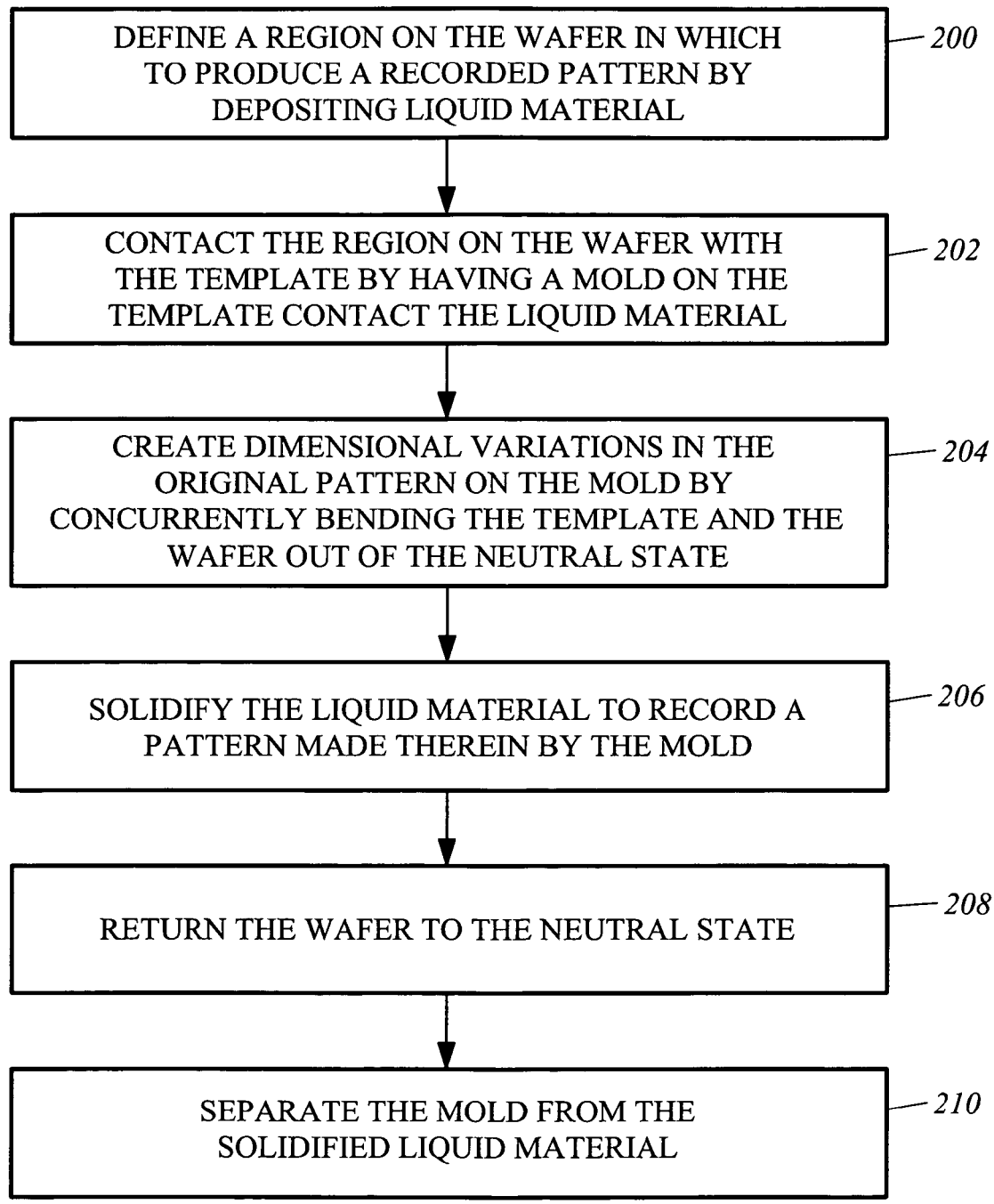
FIG. 12 is a flow diagram showing a method of controlling dimensional variations in patterns formed using imprint lithography techniques in accordance with an alternate embodiment of the present invention.

Referring to FIGS. 5 and 12, in operation, a region on wafer 30 is defined in which to produce a recorded pattern by depositing beads 36 at step 200. At step 202, contact is made between template 26 and the region on wafer 30 by having mold 28 contact beads 36. At step 204, after contact with beads by mold 28, wafer 30 and template 26 are concurrently bent to produce a contoured surface in the region and an arcuate surface on mold 28. At step 206, material 36c, shown in FIG. 4, is formed, solidifying a pattern that is the inverse of the pattern in mold 28, forming a recorded pattern. At step 208, the wafer is returned to the neutral state. Thereafter, the mold 28 and material 36c, shown in FIG. 4, are separated and wafer 30 is returned to the neutral state at step 210. In this manner, the recorded pattern is the inverse of the original pattern in mold 28 with differing relative dimensional variations, i.e., magnified or reduced.

The embodiments of the present invention described above are exemplary. Many changes and modifications may be made to the disclosure recited above, while remaining within the scope of the invention. Therefore, the scope of the invention should not be limited by the above description, but instead should be determined by the appended claims along with their full scope of equivalents.

What is claimed is:

1. A method of controlling relative dimensions between an original pattern present in a mold and a recorded pattern formed in a surface of a wafer, said method comprising:
    defining a region on said surface in which to produce said recorded pattern;
    creating dimensional variations in said original pattern by subjecting said mold to tensional stresses, defining a varied pattern;
    bending said wafer to produce a contoured surface in said region, with said contoured surface and said mold having similar radii of curvatures, wherein bending said wafer further includes providing said contoured surface with an arcuate shape having a constant radius of curvature, with said mold conforming to said arcuate shape; and
    recording said varied pattern in said region on said surface.

2. A method of controlling relative dimensions between an original pattern present in a mold and a recorded pattern formed in a surface of a wafer, said method comprising:
    defining a region on said surface in which to produce said recorded pattern;
    creating dimensional variations in said original pattern by subjecting said mold to tensional stresses, defining a varied pattern;
    recording said varied pattern in said region on said surface; and
    bending said wafer to produce a contoured surface in said region, with said contoured surface and said mold having similar radii of curvatures, wherein defining further includes defining a plurality of regions on said surface in which to produce said recorded pattern and bending further includes bending said wafer to provide a plurality of contoured surfaces, each of which has a normal associated therewith centrally disposed therein, and creating further includes providing said mold with a curved profile that is radially and symmetrically disposed about an axis and successively orientating said axis to extend parallel to each said normal associated with each of said plurality of regions.

3. A method of controlling relative dimensions between an original pattern present in a mold and a recorded pattern formed in a surface of a wafer, said method comprising:
defining a region on said surface in which to produce said recorded pattern;
creating dimensional variations in said original pattern by subjecting said mold to tensional stresses, defining a varied pattern;
recording said varied pattern in said region on said surface; and
bending said wafer to produce a contoured surface in said region, with said contoured surface and said mold having similar radii of curvatures, wherein creating further includes providing said mold with a curved profile having a first radius of curvature, and bending further includes providing said contoured surface with an arcuate shape having a second radius of curvature.

4. The method as recited in claim 1 wherein said mold includes a first surface and a first neutral axis, separated therefrom a first distance, and said wafer includes a second surface and a second neutral axis, separated therefrom a second distance, with control of said dimensional variations being dominated by a greater of said first and second distances.

5. A method of controlling relative dimensions between an original pattern present in a mold and a recorded pattern formed in a surface of a wafer, said method comprising:
defining a region on said surface in which to produce said recorded pattern;
creating dimensional variations in said original pattern by subjecting said mold to tensional stresses, defining a varied pattern;
recording said varied pattern in said region on said surface; and
bending said wafer to produce a contoured surface in said region, with said contoured surface and said mold having similar radii of curvatures, wherein creating further includes providing said mold with a curved profile having a first radius of curvature, and bending further includes providing said contoured surface with an arcuate shape having a second radius of curvature, with said second radius of curvature matching said first radius of curvature.

6. A method of controlling relative dimensions between an original pattern present in a mold and a recorded pattern formed in a surface of a wafer, said method comprising:
defining a region on said surface in which to produce said recorded pattern;
creating dimensional variations in said original pattern by subjecting said mold to tensional stresses, defining a varied pattern;
recording said varied pattern in said region on said surface; and
bending said wafer to produce a contoured surface in said region, with said contoured surface and said mold having similar radii of curvatures, wherein creating further includes providing said mold with a curved profile that is radially and symmetrically disposed about an axis to define a first radius of curvature, and bending further includes providing said contoured surface with an arcuate shape radially and symmetrically disposed about said axis to define a second radius of curvature.

7. A method of controlling relative dimensions between an original pattern present in a mold and a recorded pattern formed in a surface of a wafer, said method comprising:
defining a region on said surface in which to produce said recorded pattern;
creating dimensional variations in said original pattern by subjecting said mold to tensional stresses, defining a varied pattern;
recording said varied pattern in said region on said surface; and
bending said wafer to produce a contoured surface in said region, with said contoured surface and said mold having similar radii of curvatures, wherein creating further includes providing said mold with a curved profile that is radially and symmetrically disposed about an axis to define a first radius of curvature, and bending further includes providing said contoured surface with an arcuate shape radially and symmetrically disposed about said axis to define a second radius of curvature, with said second radius of curvature matching said first radius of curvature.

8. A method of controlling relative dimensions between an original pattern present in a mold and a recorded pattern formed in a surface of a wafer, said method comprising:
defining a region on said surface in which to produce said recorded pattern;
creating dimensional variations in said original pattern by subjecting said mold to tensional stresses, defining a varied pattern;
recording said varied pattern in said region on said surface; and
bending said wafer to produce a contoured surface in said region, with said contoured surface and said mold having similar radii of curvatures, wherein creating further includes providing said mold with a curved profile, while minimizing shear forces on said wafer, and bending further includes providing said contoured surface with an arcuate shape while minimizing shear forces on said wafer.

9. A method of controlling relative dimensions between an original pattern present in a mold and a recorded pattern formed in a layer of a wafer, said method comprising:
defining a region on said layer in which to produce said recorded pattern;
bending said wafer to produce a contoured surface in said region, wherein bending said wafer further includes providing said contoured surface with an arcuate shape having a constant radius of curvature, with said mold conforming to said arcuate shape;
creating dimensional variations in said original pattern by bending said mold, defining a varied pattern, with said contoured surface and said mold having similar radii of curvatures; and
recording said varied pattern in said layer.

10. A method of controlling relative dimensions between an original pattern present in a mold and a recorded pattern formed in a layer of a wafer, said method comprising:
defining a region on said layer in which to produce said recorded pattern;
bending said wafer to produce a contoured surface in said region;

creating dimensional variations in said original pattern by bending said mold, defining a varied pattern, with said contoured surface and said mold having similar radii of curvatures; and recording said varied pattern in said region on said layer, wherein defining further includes defining a plurality of regions on said layer in which to produce said recorded pattern and bending further includes bending said wafer to provide a plurality of contoured surfaces, each of which has a normal associated therewith centrally disposed therein, and creating further includes providing said mold with a curved profile that is radially and symmetrically disposed about an axis and successively orientating said axis to extend parallel to each said normal associated with each of said plurality of regions.

11. A method of controlling relative dimensions between an original pattern present in a mold and a recorded pattern formed in a layer of a wafer, said method comprising:

defining a region on said layer in which to produce said recorded pattern;

bending said wafer to produce a contoured surface in said region;

creating dimensional variations in said original pattern by bending said mold, defining a varied pattern, with said contoured surface and said mold having similar radii of curvatures; and recording said varied pattern in said region on said layer, wherein creating further includes providing said mold with a curved profile, having a first radius of curvature, and bending further includes providing said contoured surface with an arcuate shape having a second radius of curvature.

12. The method as recited in claim 9 wherein said mold includes a first surface and a first neutral axis, separated therefrom a first distance, and said wafer includes a second surface and a second neutral axis, separated therefrom a second distance, with magnification control being defined by a greater of said first and second distances.

13. A method of controlling relative dimensions between an original pattern present in a mold and a recorded pattern formed in a layer of a wafer, said method comprising:

defining a region on said layer in which to produce said recorded pattern;

bending said wafer to produce a contoured surface in said region;

creating dimensional variations in said original pattern by bending said mold, defining a varied pattern, with said contoured surface and said mold having similar radii of curvatures; and recording said varied pattern in said region on said layer, wherein creating further includes providing said mold with a curved profile having a first radius of curvature, and bending further includes providing said contoured surface with an arcuate shape having a second radius of curvature, with said second radius of curvature matching said first radius of curvature.

14. A method of controlling relative dimensions between an original pattern present in a mold and a recorded pattern formed in a layer of a wafer, said method comprising:

defining a region on said layer in which to produce said recorded pattern;

bending said wafer to produce a contoured surface in said region;

creating dimensional variations in said original pattern by bending said mold, defining a varied pattern, with said contoured surface and said mold having similar radii of curvatures; and recording said varied pattern in said region on said layer, wherein creating further includes providing said mold with a curved profile that is radially and symmetrically disposed about an axis to define a first radius of curvature, and bending further includes providing said contoured surface with an arcuate shape radially and symmetrically disposed about said axis to define a second radius of curvature.

15. A method of controlling relative dimensions between an original pattern present in a mold and a recorded pattern formed in a layer of a wafer, said method comprising:

defining a region on said layer in which to produce said recorded pattern;

bending said wafer to produce a contoured surface in said region;

creating dimensional variations in said original pattern by bending said mold, defining a varied pattern, with said contoured surface and said mold having similar radii of curvatures; and recording said varied pattern in said region on said layer, wherein creating further includes providing said mold with a curved profile that is radially and symmetrically disposed about an axis to define a first radius of curvature, and bending further includes providing said contoured surface with an arcuate shape radially and symmetrically disposed about said axis to define a second radius of curvature, with said second radius of curvature matching said first radius of curvature.

16. A method of controlling relative dimensions between an original pattern present in a mold and a recorded pattern formed in a layer of a wafer, said method comprising:

defining a region on said layer in which to produce said recorded pattern;

bending said wafer to produce a contoured surface in said region;

creating dimensional variations in said original pattern by bending said mold, defining a varied pattern, with said contoured surface and said mold having similar radii of curvatures; and recording said varied pattern in said region on said layer, wherein creating further includes providing said mold with a curved profile, while minimizing shear forces on said wafer, and bending further includes providing said contoured surface with an arcuate shape while minimizing shear forces on said wafer.

* * * * *